United States Patent [19]

Nagahara et al.

[11] Patent Number: 5,961,375
[45] Date of Patent: Oct. 5, 1999

[54] SHIMMING SUBSTRATE HOLDER ASSEMBLIES TO PRODUCE MORE UNIFORMLY POLISHED SUBSTRATE SURFACES

[75] Inventors: Ronald J. Nagahara, San Jose; Dawn M. Lee, Morgan Hill, both of Calif.

[73] Assignee: LSI Logic Corporation, Milpitas, Calif.

[21] Appl. No.: 08/960,925

[22] Filed: Oct. 30, 1997

[51] Int. Cl.$^6$ ...................................................... B24B 7/00
[52] U.S. Cl. .......................... 451/41; 451/285; 451/287; 451/289; 451/388
[58] Field of Search ................... 451/285–289, 451/539, 41, 291, 388

[56] References Cited

U.S. PATENT DOCUMENTS

| | | | |
|---|---|---|---|
| 3,977,130 | 8/1976 | Degner | 451/288 |
| 4,530,139 | 7/1985 | Miller . | |
| 5,533,924 | 7/1996 | Stroupe et al. | 451/286 |
| 5,573,448 | 11/1996 | Nakazima et al. | 451/41 |
| 5,643,053 | 7/1997 | Shendon et al. | 451/285 |
| 5,766,058 | 6/1998 | Lee et al. | 451/41 |

FOREIGN PATENT DOCUMENTS

| | | | |
|---|---|---|---|
| 354058294 | 5/1979 | Japan | 451/287 |
| 403098760 | 4/1991 | Japan | 451/287 |

*Primary Examiner*—Robert A. Rose
*Assistant Examiner*—George Nguyen

[57] ABSTRACT

A substrate holder assembly for retaining a substrate during chemical mechanical polishing is described. The substrate holder assembly includes: (i) a backing plate including a contact surface adapted for supporting components of the substrate holder assembly and the substrate; (ii) a shim positioned adjacent the contact surface of the backing plate for applying pressure on the substrate during chemical-mechanical polishing; and (iii) a carrier film disposed adjacent the shim such that at least a portion of the carrier film adjacent the shim protrudes outwardly.

23 Claims, 4 Drawing Sheets

SHIMMING SUBSTRATE HOLDER ASSEMBLIES TO PRODUCE MORE UNIFORMLY POLISHED SUBSTRATE SURFACES

BACKGROUND OF THE INVENTION

The present invention relates to substrate holder assemblies that retain a substrate during chemical-mechanical polishing (sometimes referred to as "CMP"). More particularly, the present invention relates to substrate holder assemblies, which include shims or shims secured by modified backing plates and retain a substrate during chemical-mechanical polishing (CMP) to produce a more uniformly polished substrate surface.

Chemical mechanical polishing (CMP) typically involves mounting a wafer faced down on a holder and rotating the wafer face against a polishing pad mounted on a platen, which in turn is rotating or in an orbital state or in linear motion. A slurry containing a chemical that chemically interacts with the facing wafer layer and an abrasive that physically removes that layer is flowed between the wafer and the polishing pad or on the pad near the wafer. In semiconductor wafer fabrication, this technique is commonly applied to polish various wafer layers such as dielectric layers, metallization, etc.

FIG. 1 shows some major components of a representative substrate holder assembly 10 that are currently integrated into a CMP apparatus. A shaft 12 lowers substrate holder assembly 10 holding a substrate 20 on a polishing pad 22 to begin CMP. Substrate holder assembly 10 includes a backing plate 14 having a convex or outwardly protruding dome shaped contact surface 15. A carrier film 18 adheres to contact surface 15 and thereby substantially conforms to protruding dome shape of the contact surface. A circumferential restraint member 16 engages the edges of substrate 20 and restrains the movement of substrate 20 outside substrate holder assembly 10. In this configuration, the protruding dome shape of contact surface 15 applies more pressure at a center region than peripheral regions of substrate 20 during CMP.

It is important to note that contact surface 15 is normally substantially planar when the substrate holder assembly is commercially obtained from manufacturers of the substrate holder assemblies, such as Integrated Processing Equipment Corporation (IPEC) of Phoenix, Ariz. At an additional cost, however, manufacturers of substrate holder assemblies may machine the contact surface to have a protruding dome shape as shown in FIG. 1 and according to specifications provided by an end user, e.g., an integrated circuit fabrication facility.

An end user may desire a contact surface having a protruding dome shaped region to effectively combat "center slow" polishing experienced by a substrate. It is well known in the art that "center slow" polishing refers to the condition when a film removal rate at a center region of a substrate surface is slower relative to the edge or peripheral regions of the substrate surface. Those skilled in the art recognize that center slow polishing conditions may set in when a polishing pad surface degrades due to repeated mechanical action of the substrate on the polishing pad during CMP. A substrate surface may suffer from center slow polishing well before the end of a production lot draws near. "Production lot" refers to a collection of substrates that are fabricated as a group under substantially similar conditions and may ultimately be sold.

Center slow polishing is undesirable because it leads to a non-uniformly polished wafer surface, i.e. the center region of the substrate surface is not polished to the same extent as the peripheral region of the substrate. In order to prevent forming non-uniformly polished substrate surfaces, the polishing pad with the degraded surface is typically replaced with a new polishing pad and the life of the polishing pad ends prematurely. In a typical integrated circuit (e.g., semiconductor wafer) fabrication facility, where several CMP apparatus are employed, the replacement cost of polishing pads can be significant.

Unfortunately, the current substrate holder assembly designs suffer from several drawbacks. By way of example, machining the contact surfaces mentioned above within the tolerances required by the end user can be an arduous, time-consuming and expensive task. Generally highly skilled workers, who may undergo extensive training, are required to perform precise machining of the contact surface. The end users, nevertheless, frequently discover that the dimensions of the protruding dome shape of the contact surface are not within the requisite tolerance levels to effectively combat center slow polishing.

Even in those instances where the dimensions of the backing plate comply with the end user's specification, the dimensions that were once deemed appropriate by the end user may no longer be suitable due to the changing parameters of the CMP system. For example, as substrate CMP proceeds through a production lot, the compressibility of the carrier film may change and/or the polishing pad characteristics are altered. In other words, the degree of center slow polishing changes as substrate CMP proceeds through a production lot. Consequently, the degree of protrusion of the dome shaped contact surface required to combat center slow polishing changes accordingly.

As another example, the protruding dome shaped of the contact surface is susceptible to undergoing deformation, e.g., formation of nicks, indentations and the like, during polishing of a production lot. The end users, therefore, may be forced to maintain several substrate holder assemblies including backing plates having varying degrees of dome shaped protrusion ready for operation in the event a backing plate is deformed or a backing plate having a different degree of dome shaped protrusion is necessary to combat the changing degree of center slow polishing.

It is well known in the art that maintaining several such substrate holder assemblies is expensive for the end user. Furthermore, the other drawbacks of the current substrate holder assembly design mentioned above translate into a lower throughput and yield of the CMP process.

What is therefore needed is an improved substrate holder assembly that facilitates in producing a more uniformly polished substrate surface, without appreciably lowering the yield or throughput of the CMP process.

SUMMARY OF THE INVENTION

To achieve the foregoing, the present invention provides a substrate holder assembly for retaining a substrate during chemical mechanical polishing. The substrate holder assembly includes: (i) a backing plate including a contact surface adapted for supporting components of the substrate holder assembly and the substrate; (ii) a shim positioned adjacent the contact surface of the backing plate for applying pressure on the substrate during chemical-mechanical polishing; and (iii) a carrier film disposed adjacent the shim such that at least a portion of the carrier film adjacent the shim protrudes outwardly.

The substrate holder assembly may further include a circumferential restraint member arranged with respect to the backing plate and adapted to engage edges of the substrate and thereby retain the substrate. In one embodiment, the contact surface of the present invention may be substantially planar. In an alternative embodiment, the contact surface of the present invention may have a concave area that recesses inwardly into the contact surface and may be sized to effectively hold the shim. By way of example,. the concave region may have a width that is between about 1 and about 100 mm and a depth that is between about 20 and about 300 $\mu$m.

The backing plate may be made from at least one of aluminum, stainless steel and ceramic material. The shim may generally be made from a material that is substantially non-compressible and flexible and preferably be made from a hard plastic material. The substrate holder assembly of the present invention may further include a shaft for holding the substrate holder assembly. The shaft may be connected to an actuator, which allows the substrate holder assembly to rotate about an axis that passes through a center point of the backing plate.

The shims and the carrier film employed in the substrate holder assembly may protrude by a maximum distance of between about 5 and about 30 $\mu$m. The carrier film may include a pressure sensitive adhesive backing to secure the carrier film to the backing plate.

In another aspect, the present invention provides a backing plate adapted to support components of a substrate holder assembly and a substrate. The backing plate includes a contact surface having a concave area that recesses inwardly into the contact surface and the concave area is sized to effectively hold a shim. The backing plate may be made from at least one of aluminum, stainless steel and a ceramic material.

In yet another aspect, the present invention provides a process of producing a substantially uniformly polished substrate surface by modifying a substrate holder assembly. The process includes: (i) determining a location on a substrate surface where the substrate holder underpolishes the substrate surface; (ii) providing a shim sandwiched between a carrier film and a backing plate of a substrate holder assembly at a position that is aligned with the location of underpolished region on the substrate surface; and (iii) polishing the substrate to produce the substantially uniformly polished substrate surface.

The process may further include polishing one or more substrates after the step of polishing the substrate. In one embodiment, the process of the present invention may further include: (i) determining an extent of uniformity achieved after the step of polishing the substrate; and (ii) placing another shim to form a composite of shims if the extent of uniformity achieved is not acceptable. In another embodiment, the process of the present invention may further include: (i) determining an extent of uniformity achieved by providing the shim after the polishing the substrate; and (ii) substituting another shim for the shim if the extent of uniformity achieved is not acceptable.

In yet another aspect, the present invention provides another process of producing a substantially uniformly polished substrate surface by modifying the substrate holder assembly. The process includes: (i) determining a location on a substrate surface where the substrate holder underpolishes the substrate surface; (ii) providing a backing plate including a contact surface having a concave area that recesses inwardly into the contact surface and location of the concave area corresponds to location of underpolished regions on the substrate surface; (iii) retaining a shim in the concave area; and (iv) polishing the substrate to produce a more uniformly polished substrate surface.

The process may further include polishing one or more substrates after the step of polishing the substrate. In one embodiment, the process of the present invention may further include: (i) determining an extent of uniformity achieved by providing the shim after the step of polishing the substrate; and (ii) placing another shim to form a composite of shims if the extent of uniformity achieved is not acceptable. In another embodiment, the process of the present invention may further include: (i) determining an extent of uniformity achieved by providing the shim after the polishing the substrate; and (ii) substituting another shim for the shim if the extent of uniformity achieved is not acceptable.

In yet another aspect, the present invention provides a substrate holder assembly for retaining a substrate during chemical-mechanical polishing. The present invention includes: (i) means for supporting having a contact surface which is adapted to support components of the substrate holder assembly and the substrate; (ii) means for applying pressure positioned adjacent the contact surface of the means for supporting and applies pressure on the substrate during chemical-mechanical polishing; and (iii) a carrier film disposed adjacent the means for applying pressure and covering a substantial portion of the contact surface such that a portion of the carrier film adjacent the means for applying pressure protrudes outwardly.

The substrate holder may further include means for restraining arranged with respect to the means for supporting and adapted to engage edges of the substrate and thereby retain the substrate. In one embodiment of the present invention, the means for supporting is a backing plate including a substantially planar contact surface. Alternatively, in an another embodiment of the present invention, the means for supporting is a backing plate including a contact surface that has a concave area that recesses inwardly into the contact surface and adapted to retain means for applying pressure.

The means for applying pressure may be a shim and may be made from a material that is substantially non-compressible and flexible. The means for applying pressure may protrude outwardly by a maximum distance of between about 5 and about 30 $\mu$m.

The present invention represents a marked improvement over the current substrate holder assembly design. By way of example, the necessary pressure to combat center slow polishing of a substrate is provided by shimming the substrate holder assembly as opposed to precisely machining a contact surface of a backing plate to have a protruding dome shape. The present invention, therefore, eliminates the drawbacks associated with the current substrate holder assembly design mentioned above, e.g., expensive, lowers the yield and throughput of the CMP process.

As another example, the design of the substrate holder assembly according to the present invention is easily implemented by making minor modifications to the current design. Either shim(s) may be inserted between the backing plate and carrier film or shim(s) may be retained in a concave region of a contact surface of a modified backing plate, which is substituted for the currently employed backing plate. Furthermore, employing shims according to the present invention provides flexibility in combating the changing degree of center slow polishing or variation of film removal rates in the underpolished regions. In other words, by merely substituting or adding another shim to the substrate holder assembly, the desired degree of uniformity is attained as the parameters of the CMP systems are altered.

These and other advantages of the present invention will be described in more detail below in the detailed description of the invention and in conjunction with the following figures.

DETAILED DESCRIPTION OF THE PREFERRED EMBODIMENTS

The present invention provides substrate holder assemblies that include shims or shims secured by modified backing plates to produce more uniformly polished substrate surfaces. In the following description, numerous specific details are set forth in order to fully illustrate a preferred embodiment of the present invention. It will be apparent, however, that the present invention may be practiced without limitation to some specific details presented herein. Those skilled in the art will recognize that profiles of some components of the substrate holder assembly, e.g., contact surface, carrier film, shim, and substrate surface, may be exaggerated to facilitate the discussion of the present invention.

Figure 1:
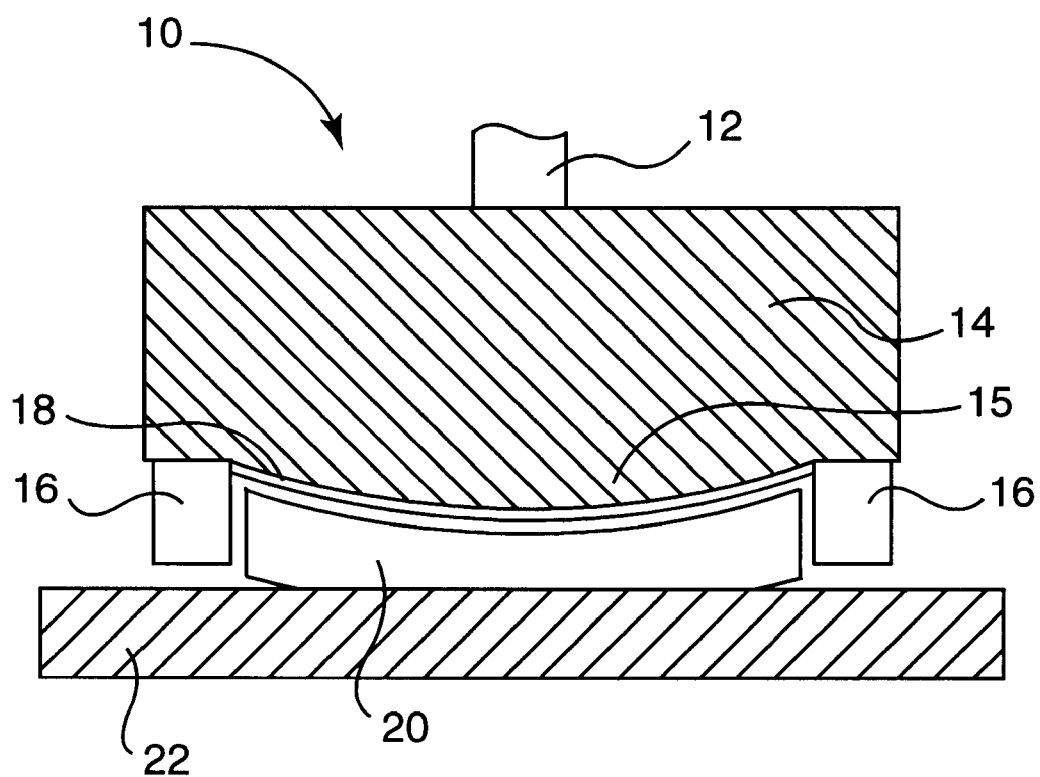
FIG. 1 shows a cross-sectional view of a representative substrate holder assembly currently employed to secure a substrate during chemical-mechanical polishing.
Figure 2A:
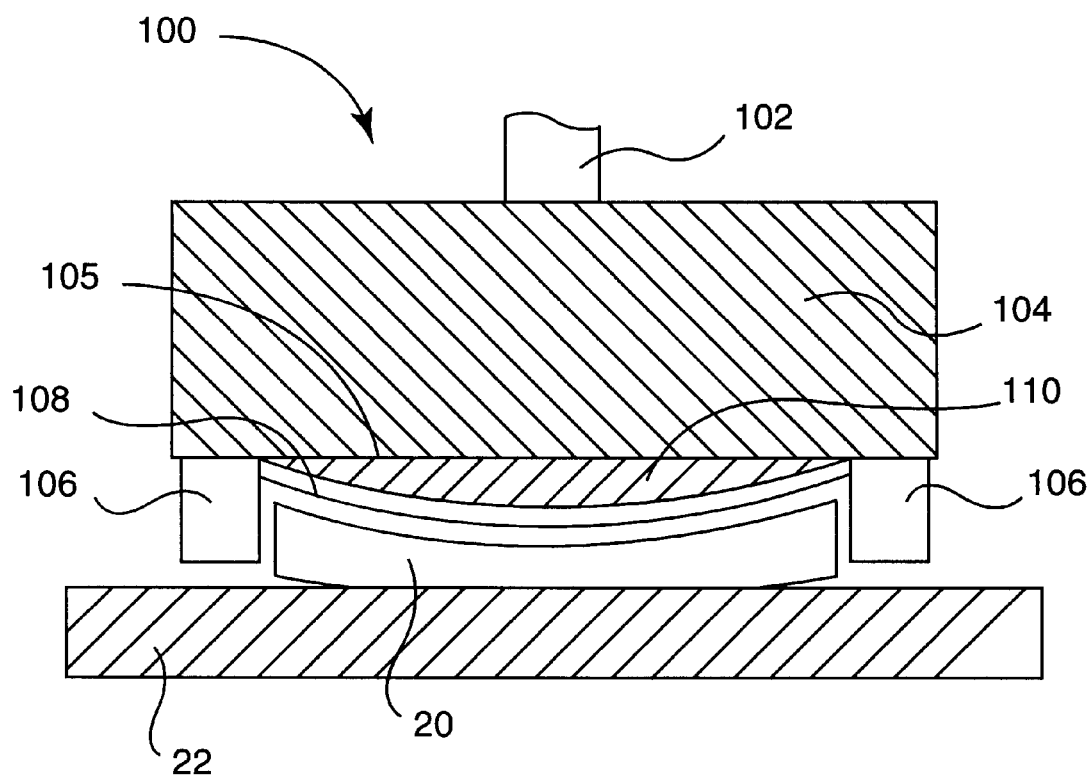
FIG. 2A shows a cross-sectional view of a substrate holder assembly, according to one embodiment of the present invention.

FIG. 2A shows a modified substrate holder assembly 100, according to one embodiment of the present invention, that includes a shim 110 sandwiched between a contact surface 105 of a backing plate 104 and a carrier film 108. Shim 110 may have one substantially planar surface that contacts contact surface 105 of backing plate 104 and have a second surface with an outwardly protruding dome shape that contacts carrier film 108. Carrier film 108, which may be made from a flexible material, therefore, acquires the shape of the protruding shim 110 and contacts the center region of substrate 20. A circumferential restraint member 106 engages the edges of a substrate 20 and restrains the movement of substrate 20 outside substrate holder assembly 100. In this configuration, protruding dome shape of shim 110 provides the requisite pressure to a center region of substrate 20 during CMP to effectively combat center slow polishing conditions.

A shaft 102, which is used to lower substrate holder assembly 100 on polishing pad 22, may be connected to an actuator or a motor that allows substrate holder assembly 100 to rotate about an axis that passes through a center point of backing plate 104. Shaft 102 is typically a hollow body, through which the necessary provisions to maintain the necessary vacuum conditions for the robotic transport of substrate 20 and to supply the necessary back pressure during CMP are provided.

Figure 2B:
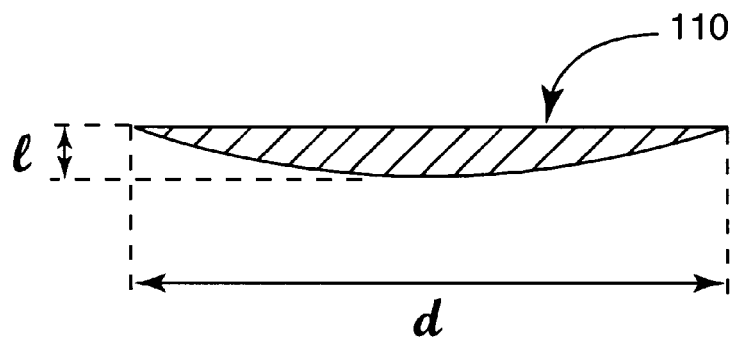
FIG. 2B shows a cross-sectional view of a shim employed in the substrate holder assembly of FIG. 2A.

FIG. 2B shows a cross-sectional view of a protruding dome shaped circular shim 110 having a diameter "d" and a maximum protruding length "1". Shim 110 is generally made from a material that is capable of applying the necessary pressure to a substrate during CMP to effectively combat center slow polishing. In a preferred embodiment, however, shim 110 may be made from a flexible and non-compressible material and in a more preferred embodiment shim 110 may be made from a hard plastic material, e.g., Mylar®, which is trademark of E. I. du Pont de Nemours and Company and commercially available from distributors, such as EIS Company of Atlanta, Geo.

Diameter "d" of shim 110 may be large enough to provide stability to the arrangement of backing plate 104, shim 110 and carrier film 108 as described above. It is important that shim 110 does not slide out of position between backing plate 104 and carrier film 108 and therefore in a preferred embodiment, shim 110 may match the diameter of the carrier film or the contact surface. Distance of maximum protrusion "l" may generally be high enough to apply the requisite pressure on the substrate during CMP to effectively combat the degree of center slow polishing and may preferably range from between about 5 and about 30 µm.

Although, FIG. 2A shows that the degree and profile of protrusion is accomplished by placing a single shim between backing plate 104 and carrier film 108, those skilled in the art will recognize that two or more shims may be superimposed to form a composite of shims and accomplish the necessary degree and profile of protrusion.

Shaft 10 may be made from a metal, such as aluminum or stainless steel. Backing plate 104 may be made from a rigid material, which may include at least one of anodized aluminum, stainless steel or ceramic material. Carrier film 108 may include a poromeric material and a pressure sensitive adhesive backing tape that ensures adhesion of the carrier film to shim 110. Of course if shim 10 is not as large as carrier film 108, then the pressure sensitive adhesive backing ensures adhesion of the carrier film to a portion of the contact surface. Carrier film 110 is commercially available from Rodel of Newark, Del.

Substrate holder assembly 100 of FIG. 2A is preferably employed in a conventional CMP apparatus, such as the Avanti 472, commercially available from Integrated Processing Equipment Corporation (IPEC) of Phoenix, because the underpolished substrate regions are typically located at the center region of the substrate surface. In a more modern CMP apparatus, e.g., AvantGaard 676 also commercially available from IPEC, however, the underpolished substrate surface regions are circular ring shaped regions that are typically located between the center and peripheral regions of the substrate surface. These underpolished substrate surface regions are polished in varying degrees relative to each other and appear as different colored rings, i.e. the color of the ring may depend on the extent of polishing or film removal in that region.

Figure 3A:
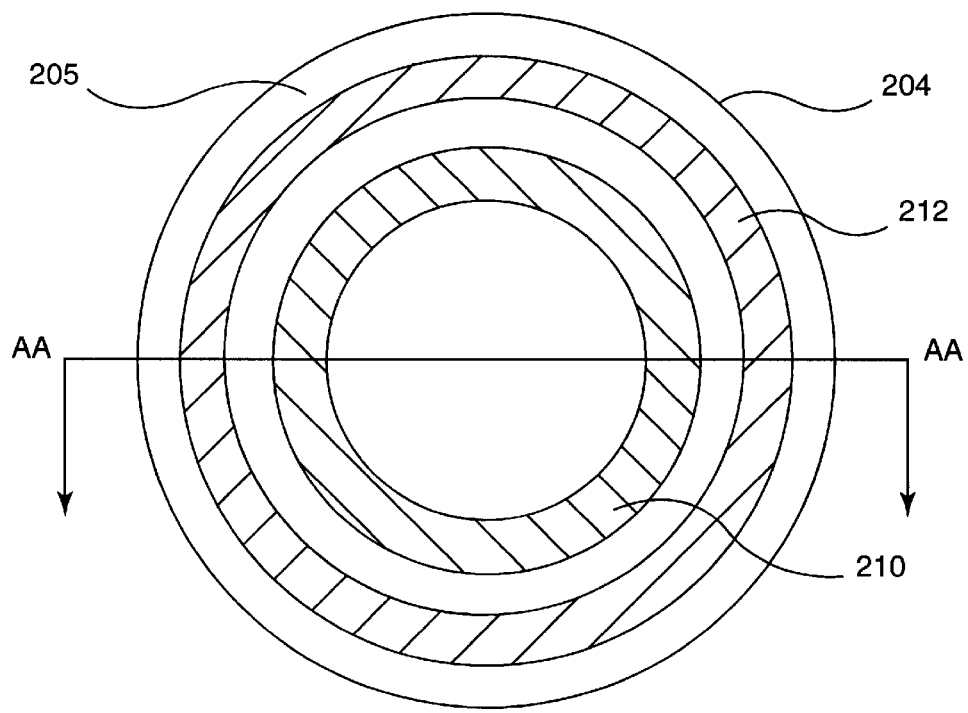
FIG. 3A shows a top view of substantially circular shims arranged on a backing plate that can be integrated into a substrate holder assembly of the present invention.

FIG. 3A shows a plurality of shims 210 and 212 arranged on a contact surface 205 of a backing plate 204, which may be incorporated into a substrate holder assembly of the present invention as shown in FIG. 2A. The location of shims 210 and 212 on contact surface 205 is aligned with the location of underpolished rings on the substrate surface mentioned above. In this configuration, shims 210 and 212 apply the requisite pressure on the substrate surface regions that would be underpolished and ensure that the substrate surface is uniformly polished.

Figure 3B:
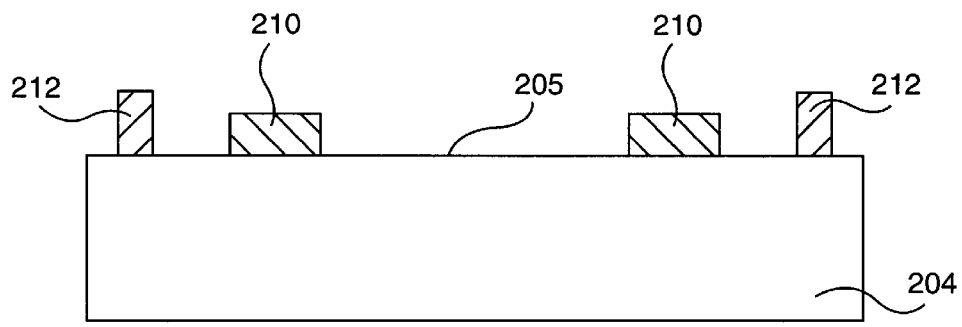
FIG. 3B shows a cross-sectional view of substantially circular shims arranged on a backing plate, according to one embodiment of the present invention.

FIG. 3B shows a cross-sectional view of the backing plate-shim sub-assembly along the line AA of FIG. 3A. FIG. 3B shows shims 210 and 212 arranged on a substantially planar contact surface 205 of backing plate 204. Of course, a carrier film, which is substantially similar to carrier film 108 of FIG. 2A, adheres to those portions of the contact surface that are not adjacent shims 210 and 212 and facilitates in securing shims 210 and 212 to backing plate 204. The thickness or degree of protrusion of shim 210 may be greater than that of shim 212 as shown in FIG. 3B and shim 212 may therefore apply a greater pressure on a portion of the substrate surface than shim 210.

Figure 3C:
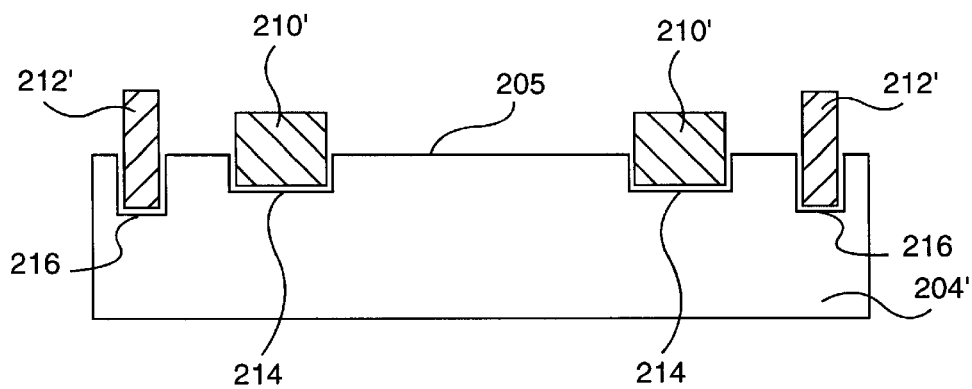
FIG. 3C shows a cross-sectional view of circular shims arranged on a modified backing plate, according to an alternative embodiment of the present invention.

FIG. 3C shows another backing plate 204', according to an alternative embodiment of the present invention, including a non-planar surface 205' that retains shims 210' and 212'. Contact surface 205' has cavities or concave regions 214 and 216 that recess inwardly into the contact surface, which cavities or regions may be sized to retain shims 210' and 212'. By way of example, concave regions may have a width that is generally between about 1 and about 100 mm and a depth that is generally between about 20 and about 300 $\mu$m to effectively retain the shims.

This embodiment is particularly useful when the shims are elatively thin and/or tend to buckle or crumple and displace from their position. In the embodiment of FIG. 3B, shims 210' and 212' are effectively retained in concave regions 214 and 216 and are thereby prevented from being displaced from their position. Of course carrier film adhering to portions of contact surface that does not have any shims further reinforces the shim positions. Those skilled in the art will recognize that more or less than two shims can similarly be secured on a backing plate depending on the number of underpolished regions present on the substrate surface.

Figure 4:
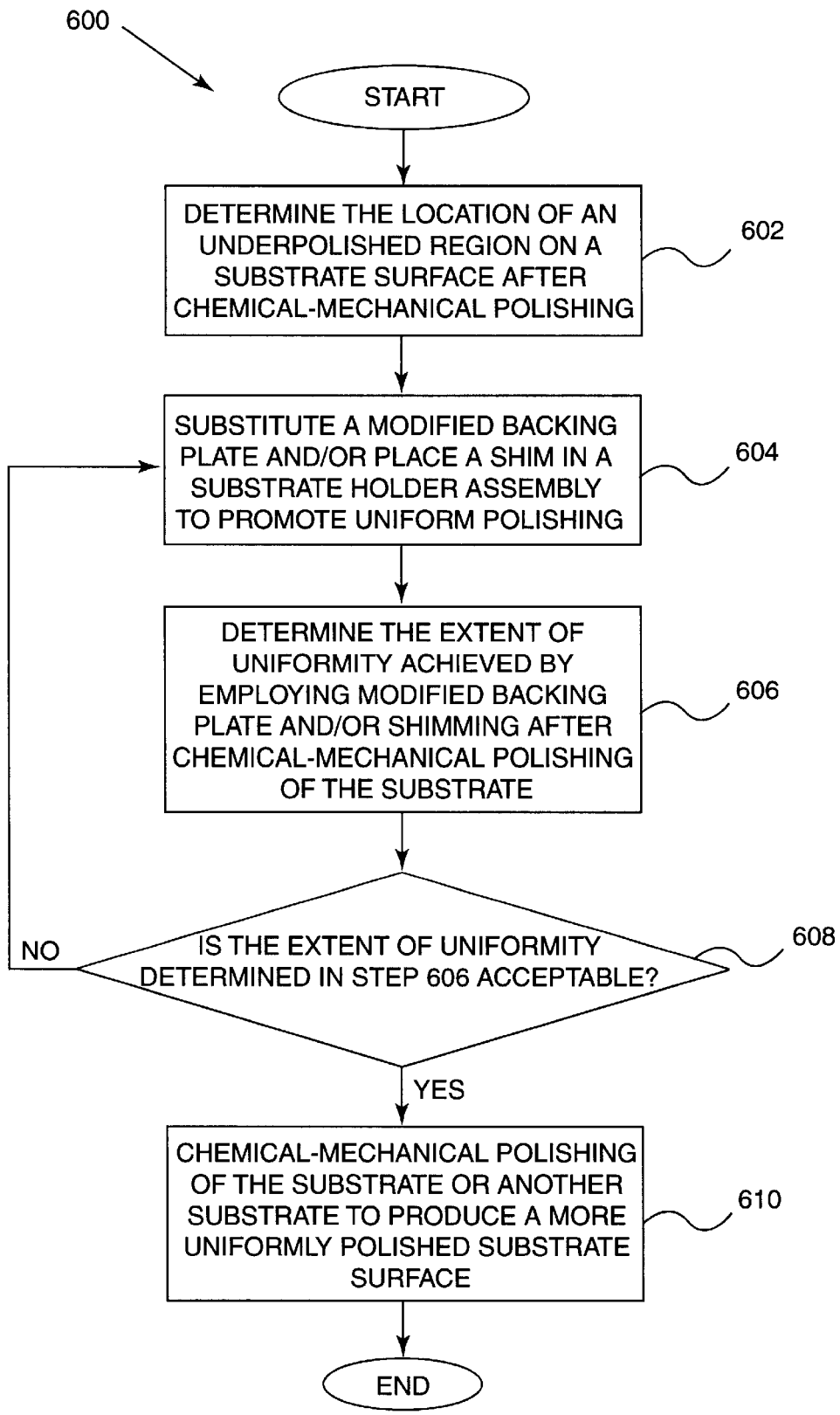
FIG. 4 shows a process for forming a more uniformly polished substrate surface, according to one embodiment of the present invention.

FIG. 4 shows a process 600 of forming a uniformly polished substrate surface, according to one embodiment of the present invention. A step 602 includes determining the location of underpolished regions on a substrate surface. By way of example, in the CMP apparatus Avanti 472 mentioned above, the center region of the substrate surface is typically underpolished when a substrate experiences center slow polishing. As a further example, in the CMP apparatus AvantGaard 676 also mentioned above, rings of underpolished regions are located between the center and peripheral regions of the substrate surface. In other cases, step 602 may be carried out by examining the polished substrate surface under visual inspection systems, such as microscopes, scanning electron microscopes (SEMs) and automatic machines well known to those skilled in the art.

Next, in a step 604, a shim may be employed in substrate holder assembly or a shim may be retained in a modified backing plate of the present invention, which backing plate is substituted for the conventional backing plate. By way of example, a shim or shims may be inserted between a carrier film and a backing plate as shown in FIGS. 2A and mentioned in the discussion pertaining to FIG. 3B. As another example, shims may be retained in concave regions of a contact surface of a modified backing plate of the present invention as shown in FIG. 3C. As mentioned above, the location of shim(s) and the concave region of the contact surface may be aligned with the location of the underpolished substrate surface regions.

After chemical-mechanical polishing the substrate, a step 606 includes determining the extent of uniformity achieved by employing shim(s) or shim(s) and a modified backing plate. By way of example, this may be carried out by examining the polished substrate surface under visual inspection systems, such as microscopes, scanning electron microscopes (SEMs) and automatic machines well known to those skilled in the art.

In a step 608 it is inquired whether the extent of uniformity achieved is acceptable. By way of example, in this step an end user may determine whether the uniformity accomplished is within the tolerance levels set by the design rules or requirements of the subsequent process steps, e.g., etching, photolithography, etc. If it is determined that the extent of uniformity is not acceptable, shim(s) or shim(s) and modified backing plate are included or substituted in the substrate holder assembly as described in step 604. It should be borne in mind that an additional shim may be added to the substrate holder assembly to form a composite of shims that effectively apply the requisite amount of pressure to produce a uniformly polished substrate surface. Next, steps 606 and 608 may be carried out until the extent of uniformity achieved is acceptable.

In a step 610, the substrate surface or another substrate surface from the substrates remaining in the production lot then undergo CMP to produce a more uniformly polished substrate surface, if the extent of uniformity determined in step 606 is acceptable.

The present invention represents a marked improvement over the current substrate holder assembly design. By way of example, the necessary pressure to combat center slow polishing of a substrate is provided by shimming the substrate holder assembly as opposed to precisely machining a contact surface of a backing plate to have a protruding dome shape. The present invention, therefore, eliminates the drawbacks associated with the current substrate holder assembly design mentioned above, e.g., expensive, lowers the yield and throughput of the CMP process.

As another example, the design of the substrate holder assembly according to the present invention is easily implemented by making minor modifications to the current design. Either shim(s) may be inserted between the backing plate and carrier film or shim(s) may be retained in a concave region of a contact surface of a modified backing plate, which is substituted for the currently employed backing plate. Furthermore, employing shims according to the present invention provides flexibility in combating the changing degree of center slow polishing or variation of film removal rates in the underpolished regions. In other words, by merely substituting or adding another shim to the substrate holder assembly, the desired degree of uniformity is attained as the parameters of the CMP systems are altered.

Although the foregoing invention has been described in some detail for purposes of clarity of understanding, it will be apparent that certain changes and modifications may be practiced within the scope of the appended claims. For example, while the specification has described the substrate holder assemblies of the present invention to be used in the context of integrated circuit of semiconductor wafer CMP, there is no reason why in principle such substrate holder assemblies could not be used in other polishing applications, e.g., polishing optical substrates, magnetic media substrates, etc. Therefore, the present embodiments are to be considered as illustrative and not restrictive, and the invention is not to be limited to the details given herein, but may be modified within the scope of the appended claims.

What is claimed is:

1. A substrate holder assembly for retaining a substrate during chemical mechanical polishing, comprising:

a backing plate including a contact surface adapted for supporting components of said substrate holder assembly and said substrate;

a shim positioned adjacent said contact surface of said backing plate for applying pressure on said substrate during chemical-mechanical polishing; and a carrier film disposed adjacent said shim such that at least a portion of said carrier film adjacent said shim protrudes outwardly, wherein said backing plate having a concave area that recesses inwardly into the contact surface and sized to effectively hold said shim.

2. The substrate holder assembly of claim 1, further comprising a circumferential restraint member arranged with respect to the backing plate and adapted to engage edges of the substrate and thereby retain said substrate.

3. The substrate holder assembly of claim 1, the concave region has a width that is between about 1 and about 100 mm and a depth that is between about 20 and about 300 pm.

4. The substrate holder assembly of claim 1, wherein said backing plate is made from at least one of aluminum, stainless steel and ceramic material.

5. The substrate holder assembly of claim 1, wherein said shim is made from a material that is substantially non-compressible and flexible.

6. The substrate holder assembly of claim 1, wherein said shim is made from a hard plastic material.

7. The substrate holder assembly of claim 1, further comprising a shaft for holding the substrate holder assembly and connected to an actuator which allows the substrate holder assembly to rotate about an axis that passes through a center point of the backing plate.

8. The substrate holder assembly of claim 1, wherein said carrier film protrudes by a maximum distance of between about 5 and about 30 $\mu$m.

9. The substrate holder assembly of claim 1, wherein said carrier film includes a pressure sensitive adhesive backing to secure the carrier film to the backing plate.

10. A backing plate adapted to support components of a substrate holder assembly and a substrate, comprising a contact surface having a concave area that recesses inwardly into said contact surface and said concave area is sized to effectively hold a shim.

11. The backing plate of claim 10, wherein the backing plate is made from at least one of aluminum, stainless steel and a ceramic material.

12. A process of producing a substantially uniformly polished substrate surface by modifying a substrate holder, comprising;

determining a location on a substrate surface where the substrate holder underpolishes the substrate surface;

providing a shim sandwiched between a carrier film and a backing plate of a substrate holder assembly at a position that is aligned with the location of underpolished region on said substrate surface;

polishing said substrate to produce the substantially uniformly polished substrate surface;

determining an extent of uniformity achieved by providing said shim after said polishing said substrate; and if the extent of uniformity achieved is not acceptable, either (i) substituting another shim for said shim or (ii) placing another shim to form a composite of shims.

13. The process of claim 12, further comprising polishing one or more substrates after said polishing said substrate.

14. A process of producing a substantially uniformly polished substrate surface by modifying a substrate holder, comprising:

determining a location on a substrate surface where the substrate holder underpolishes the substrate surface;

providing a backing plate including a contact surface having a concave area that recesses inwardly into said contact surface and location of said concave area corresponds to location of underpolished regions on said substrate surface;

retaining a shim in said concave area; and polishing said substrate to produce a more uniformly polished substrate surface.

15. The process of claim 14, further comprising polishing one or more substrates after said polishing said substrate.

16. The process of claim 14, further comprising:

determining an extent of uniformity achieved after said polishing said substrate; and placing another shim to form a composite of shims if the extent of uniformity achieved is not acceptable.

17. The process of claim 14, further comprising:

determining an extent of uniformity achieved after said polishing said substrate; and substituting another shim for said shim if the extent of uniformity achieved is not acceptable.

18. A substrate holder assembly for retaining a substrate during chemical-mechanical polishing, comprising:

means for supporting including a contact surface which is adapted to support components of said substrate holder assembly and said substrate;

means for applying pressure positioned adjacent said contact surface of said means for supporting and applies pressure on said substrate during chemical-mechanical polishing; and a carrier film disposed adjacent said means for applying pressure and covering a substantial portion of said contact surface such that a portion of said carrier film adjacent said means for applying pressure protrudes outwardly, wherein the means for supporting includes a contact surface that has a concave area that recesses inwardly into the contact surface and adapted to retain means for applying pressure.

19. The process of claim 18, further comprising a means for restraining arranged with respect to said means for supporting and adapted to engage edges of said substrate and thereby retain said substrate.

20. The substrate holder of claim 18, wherein said means for supporting is a backing plate including a substantially planar contact surface.

21. The substrate holder of claim 18, wherein said means for applying pressure is a shim.

22. The substrate holder of claim 18, wherein said means for applying pressure is made from a material that is substantially non-compressible and flexible.

23. The substrate holder of claim 18, wherein said means for applying pressure protrudes outwardly by a maximum distance of between about 5 and about 30 $\mu$m.

* * * * *